United States Patent [19]

Kljuchko et al.

[11] Patent Number: 4,492,845
[45] Date of Patent: Jan. 8, 1985

[54] PLASMA ARC APPARATUS FOR APPLYING COATINGS BY MEANS OF A CONSUMABLE CATHODE

[76] Inventors: Gennady V. Kljuchko, prospekt Kurchatova, 27, kv. 68; Valentin G. Padalka, ulitsa Danilevskogo, 10, kv. 122; Leonid P. Sablev, ulitsa P. Morozova, 3, kv. 3; Rimma I. Stupak, ulitsa Valtera, 12, kv. 32, all of Kharkov, U.S.S.R.

[21] Appl. No.: 416,310

[22] Filed: Sep. 9, 1982

[51] Int. Cl.³ .................... B23K 9/00; C23C 15/00
[52] U.S. Cl. .................... 219/121 P; 219/121 PR; 219/121 PL; 204/192 R; 204/298; 427/47; 427/34
[58] Field of Search ...... 219/121 P, 121 PR, 121 PM, 219/121 PD, 121 PG, 76.16, 121 PL, 123; 204/192 R, 192 E, 192 EC, 293, 298; 427/34, 47

[56] References Cited

U.S. PATENT DOCUMENTS

| 3,625,848 | 12/1971 | Snapper . | |
| 3,836,451 | 9/1974 | Snapper . | |
| 4,090,941 | 5/1978 | Wright et al. . | |
| 4,219,397 | 8/1980 | Clarke . | |
| 4,221,652 | 9/1980 | Kuriyama | 204/192 R |
| 4,243,505 | 1/1981 | Penfold . | |
| 4,252,626 | 2/1981 | Wright et al. | 204/192 R |
| 4,370,539 | 1/1983 | Garlanov et al. | 219/121 PP |
| 4,386,258 | 5/1983 | Akashi et al. | 219/121 PM |
| 4,407,713 | 10/1983 | Zega | 204/192 R |

FOREIGN PATENT DOCUMENTS 1258301 12/1971 United Kingdom .

OTHER PUBLICATIONS

"Pulsed Metallic-Plasma Generators", proceedings of the IEEE, of vol. 60, No. 8, Aug. 1972, pp. 977-991.
I. I. Aksenov, V. A. Belous et al., Ustroystvo Dly Ochistki Plasmy Vakuumnoi Dugi ot Makrochastits-.—"Pribory i Tekhnika Eksperimenta", M., 1978, No. 5, s. 236-237.
V. A. Osipov, V. G. Padalka et al., Ustanovka Dly Nanesenia Pokryty Osazhdeniem Ionov; Izvelkayemykh iz Plazmy Vakuumnoi Dugi.—"Pribory i Tekhnika Eskperimenta", M., 1978, No. 6, S 173-175.

Primary Examiner—M. H. Paschall
Attorney, Agent, or Firm—Fleit, Jacobson, Cohn & Price

[57] ABSTRACT

A plasma arc apparatus comprises a working anode chamber in the form of a pipe of a non-magnetic metal, a consumable cathode provided with an opening for a work to be installed therein, the cathode having a cross-sectional configuration which coincides with that of this pipe, a starting electrode connected with the cathode and current sources for starting and feeding an arc between the anode and cathode. The cathode is disposed within the anode in axial relation therewith so that the lateral surface of the cathode faces the anode and functions as an evaporation surface whose width is less than the length of the anode. On the outer side of the anode there is mounted a magnetic system for deviating ions of the plasma produced by the arc in the direction of the work. The apparatus also can be provided in the form of multiple, spaced consumable cathodes within a unitary working anode chamber or within a plurality of aligned but electrically insulated working anode chambers that correspond in number with the number of cathodes.

14 Claims, 8 Drawing Figures

PLASMA ARC APPARATUS FOR APPLYING COATINGS BY MEANS OF A CONSUMABLE CATHODE

BACKGROUND OF THE INVENTION

1. Field of the Invention

The present invention relates to plasma spraying process and more particularly to plasma arc apparatus for applying mostly metal coatings to works of various configuration, especially to elongated works.

Most advantageously the invention may be used to apply strengthening, decorative and other coatings in tool producing industry, medicine, jewelry and other fields.

2. Description of the Prior Art

An important problem encountered by those skilled in the art when developing plasma arc apparatus for applying coatings consists in improving the quality of a surface of a part subjected to spraying process ensuring required physical and mechanical properties of the latter. The main factor which prevents the solution of this problem is the presence of electrically neutral macroparticles: drops and solid fragments of the evaporating material of the cathode in the plasma stream produced by this material. The above macroparticles deteriorate the surface of the part being treated. To prevent this, magnetic separation is used in order to separate the plasma stream into neutral and charged particles so that a part could be treated by charged particles only.

Known in the art is a plasma arc apparatus wherein the separation of the plasma stream occurs when the plasma stream moves in a curvilinear plasma guide provided with a magnetic system (see I. I. Aksenov, V. A. Belous et al. Ustroystvo dly ochistki plasmy vakuumnoi dugi ot makrochastits. "Pribory i tekhnika eksperimenta", M., 1978, No. 5, s. 236-237). When using this apparatus, the neutral particles are deposited on the walls of the plasma guide, whereas the charged particles (positive ions) are diverted by the magnetic system and are directed through the plasma guide to the work being treated.

A substantial disadvantage of this apparatus consists in considerable losses of charged particles which are deposited on the walls of the plasma guide because of energetic losses and because of an extended length of the latter.

There is also known in the art another plasma arc apparatus for applying coatings, comprising a working anode chamber of a non-magnetic metal, a consumable cathode disposed in this chamber whose evaporation surface faces the anode, a starting electrode contacting the cathode, a direct current source for feeding an arc, a pulsed current source for starting the arc and a magnetic system mounted on the anode (see V. A. Osipov, V. G. Padalka et al. Ustanovka dly nanesenia pokryty osazhdeniem ionov, izvlekayemykh iz plazmy vakuumnoi dugi. "Pribory i tekhnika eksperimenta", M., 1978, No. 6, s. 173-175).

In this apparatus the direct current source for feeding the arc is connected with the cathode and anode, and the pulsed current source for starting the arc is connected with the cathode and the starting electrode. Said magnetic system is intended for diverting charged particles of plasma from the surface of the anode in the direction of the work being treated. Te butt-end surface of the cathode is the evaporation surface thereof. The apparatus is provided with an additional magnetic system intended to maintain the cathode spot on the butt-end surface of the cathode (this system is described in detail in USSR Inventor's Certificate No. 307,666, published in 1979). The working anode chamber of the apparatus is conically shaped and is provided in the butt-end with a cover. On the inner surface of the cover there are installed works to be treated. There is also provided a cup disposed adjacently the central portion of the cover. In this cup the above cathode is disposed made in the form of a relatively short cylinder with a rod. The butt-end of the cathode is disposed practically in one plane with the inner surface of the cover.

In operation of the described apparatus the plasma stream comprising vapours of the material of the cathode is directed to the anode. The working conditions of the apparatus are selected such that the positive ions contained in the stream are diverted by the electric field produced in the plasma under the influence of the magnetic field in the region of the conical surface of the anode and are directed towards the cover. These positive ions are deposited on the works being treated while the neutral macroparticles are deposited on the inner surface of the anode.

In the course of operation of this apparatus there occur certain difficulties which prevent an extensive use thereof. Thus, the plasma spraying process carried out by this apparatus can be used for treating but one surface of a work. To treat another surface of the same work, it is necessary to switch off the apparatus and to turn the work over either manually or with the aid of a special mechanism. For this same reason it is rather difficult to treat works in the form of bodies of revolution.

In addition, because of small area of the working surface of the cover it is impossible to treat elongated works, such as rods, strips, cores and bands.

It is also to be noted that, since the evaporation surface in the above-described apparatus is the butt-end thereof whose area is usually not more than 200 cm$^2$, the efficiency of the apparatus is substantially reduced, which makes it necessary to increase the consumption of electric energy. This latter necessity detrimentally affects the process of evaporation of the cathode material and, consequently, leads to rapid consumption thereof, frequent replacement of the cathode and to deterioration of the quality of the surface subjected to plasma spraying process.

SUMMARY OF THE INVENTION

A principal object of the present invention is to provide a plasma arc apparatus for applying coatings which makes it possible to continuously treat a work on all sides thereof and at the same time to ensure high quality of the surface subjected to plasma spraying process.

Another important object of the invention is to provide a plasma arc apparatus which makes it possible to treat elongated works.

Another object of the invention is to provide a plasma arc apparatus whose efficiency is higher than that of conventional plasma arc apparatus.

One more object of the invention is to provide a plasma arc apparatus wherein no frequent replacement of a consumable cathode is needed.

An additional object of the invention is to provide an economical plasma arc apparatus.

Still another object of the invention is to provide a simple in construction and easy in operation plasma arc apparatus for applying coatings.

These and other objects of the present invention are attained by that there is provided a plasma arc apparatus for applying coatings comprising a working anode chamber of a non-magnetic metal, a consumable cathode arranged in this chamber and having its evaporation surface faced to the anode, a starting electrode in contact with the cathode, a direct current source for feeding an arc, connected with the anode and the cathode, a pulsed current source for starting the arc, connected with the cathode and the starting electrode, and a magnetic system mounted on the anode and intended for diverting charged plasma particles from the surface of the anode towards a work being treated, wherein, according to the invention, the working anode chamber has a configuration of a pipe of a uniform cross-section with said magnetic system mounted on the outer side thereof, and the cathode has a cross-sectional configuration which substantially coincides with the configuration of said pipe and is provided with an opening for the work to be installed therein in a working position, the cathode being axially aligned with said pipe so that its lateral surface forms, the evaporation surface thereof, and the width of said lateral surface is less than the length of the anode.

The term "a pipe of a uniform cross-section" is used herein as a generic geometrical term to denote any pipe having the same cross-sectional area along the whole length thereof. The cross-sectional configuration of the pipe may be not only circular but also oval, rectangular polyhedral and other.

Such arrangement of the plasma arc apparatus makes it possible to install a work in the opening of the cathode and to treat it on all sides by a plasma stream (plasma cloud), since the latter, due to an enveloping (tubular) form of the anode, rotates under the action of the magnetic field around the work in a plane perpendicular to the axis thereof. Since in this case the lateral surface of the cathode is the evaporation surface thereof, the conditions of evaporation of the material of the cathode and the plasma separation process improve, which favourably effects the quality of the surface of the work subjected to plasma spraying process.

One of the simplest in manufacturing is a modification of the proposed plasma arc apparatus, wherein the working anode chamber has a configuration of a cylindrical pipe. When using this modification, the electric arc is more stable and the plasma spraying process proceeds better.

It is advisable that the width of the lateral surface of the cathode in the proposed apparatus be from 0.05 to 0.5 of the length of the anode. This ensures the best conditions for treating a work. If the width of the lateral surfaces of the cathode is less than 0.05 of the length of the anode, then in the conditions of serial production the required efficiency of the plasma spraying process can not be ensured. If the width of said surface of the cathode is more than 0.5 of the length of the anode, then the working zone of the proposed apparatus is used not rationally, which leads to higher losses of the material being evaporated.

When using the modification of the proposed apparatus with a cylindrical anode, it is advisable that the lateral surface of the cathode be also either cylindrical, or polyhedral. The first configuration of the cathode is the most suitable from the technological point of view, and the other is more suitable for making the cathode from lengths of strip material.

It is recommended that the whole surface of the cathode, excluding the evaporation surface, be covered with a screen. This increases the reliability of the apparatus and the quality of the works subjected to plasma spraying process.

Rather useful may prove to be such a modification of the apparatus, wherein the apparatus further comprises one more cathode disposed in the working anode chamber and provided with a starting electrode and similar to said first cathode, said first and second cathode being axially aligned on the periphery of said anode chamber and electrically insulated from one another. As compared with above-described modifications (having one cathode) this one allows a more uniform coating to be obtained and for a shorter period of time.

Possible is another modification of the apparatus, wherein the apparatus comprises several (more than two) similar cathodes axially aligned in the working anode chamber, provided with starting electrodes and electrically connected between themselves by common current rods, and also has a control unit, connected with the starting electrode of each cathode, for successively switching on and off the cathodes. This modification of the apparatus is particularly suitable for treating elongated works.

When treating elongated works, one more modification of the apparatus may be used, wherein the working anode chamber is divided into separate and electrically insulated from one another anode sections, the apparatus additionally comprising several cathodes provided with starting electrodes and similar to the first cathode so that the total number of all the cathodes is equal to the number of anode sections, said cathode being electrically connected between themselves by common current rods and each of the cathodes being axially aligned in each of the anode sections. For treating elongated works this modification of the apparatus offers the highest efficiency due to simultaneous operation of all the electrical groups "anode section—cathode". In each of the groups there is formed a rotating plasma cloud.

BRIEF DESCRIPTION OF THE DRAWINGS

Now the invention will be described by way of embodiments thereof with reference to the accompanying drawings, in which.

DETAILED DESCRIPTION OF THE INVENTION

Figure 1:
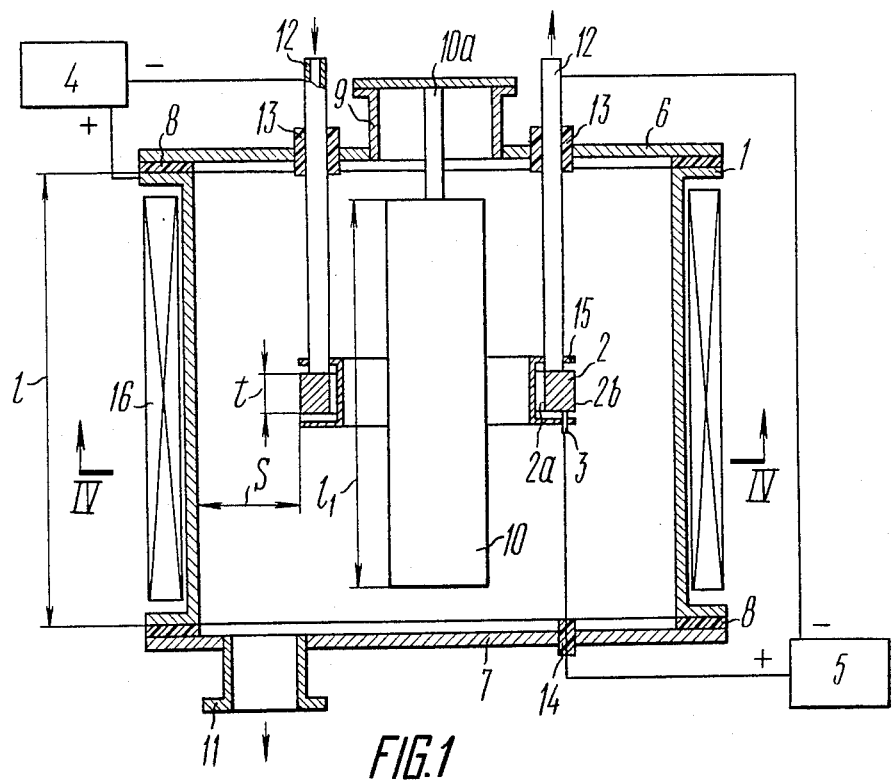
FIG. 1 is a longitudinal section of the proposed plasma arc for applying coating, in modification with one cathode.

The plasma arc apparatus for applying coatings according to the invention comprises an anode chamber 1 of a non-magnetic metal (see FIG. 1 of the accompanying drawings), a consumable cathode 2, a starting electrode 3, a direct current source 4 and a pulsed current source 5 respectively for feeding and for starting the arc between the cathode 2 and the anode 1.

The working anode chamber 1 has a configuration of a pipe, in particular cylindrical, of a uniform cross section. The pipe is closed at its butt-ends by covers 6 and 7 insulated from this chamber 1 by insulating packings 8. The cover 6 has an inlet 9 for charging a work 10 to be treated into the chamber 1, and the cover 7 has a pipe connection piece II wherethrough the chamber 1 communicates with the system for producing vacuum (for simplicity reasons this system is not shown and evacuation of gas from the chamber 1 is shown by an arrow).

The cathode 2 is installed in the anode chamber 1 with the aid of current rods 12 mounted in insulating bushes 13 secured to the cover 6. The direct current source 4 is connected with the anode 1 and one of the rods 12, whereas the pulsed current source is connected with the other rod 12 and the starting electrode 3. The latter is made from ceramics and is brought in contact with the cathode 2 and is passed through the insulating bush 14 secured to the cover 7.

The cathode 2 has a cross-sectional configuration which substantially coincides with the configuration of the anode chamber 1 and is provided with an opening 2a for the work 10 to be installed therein in a working position as shown in FIG. 1. The cathode 2 is axially aligned with the anode 1 so that its lateral surface 2b is the evaporation surface thereof. The width "t" of this surface 2b is less than the length "l" of the anode chamber 1. The results of the experiments prove that the best results are attained if "t" is from 0.05 to 0.5 of the length "l" of the anode 1. To prevent accidental establishment of the arc between the anode and other surfaces of the cathode 2, the latter are covered by a screen 15.

The apparatus is also provided with a magnetic system which may be a solenoid 16 mounted on the outer side of the anode chamber 1 and connected to a direct current source (not shown).

This magnetic system is intended for producing a magnetic field within the anode chamber 1, which field aids in deviating charged particles of plasma from the surface of the anode 1 in the direction of the work 10. It will be understood that this magnetic system may be otherwise constructed, for instance in the form of constant magnets (not shown).

To improve the operation conditions of the cathode 2, it is advisable to cool it with water, for instance through said current rods 12, for which purpose the latter are made hollow (water supply and withdrawal are shown by arrows).

Figure 3:
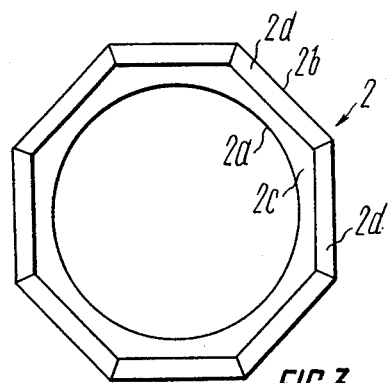
FIGS. 2 and 3 show an end face view of possible shapes of the cathode for use in a modification of the proposed apparatus, wherein the anode chamber has a configuration of a cylindrical pipe.
Figure 2:
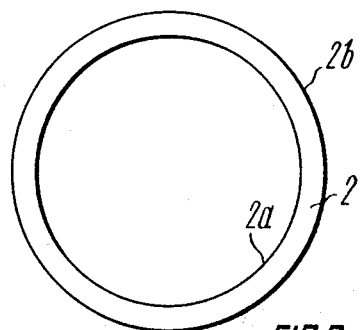

If the anode chamber 1 has a configuration of a cylindrical pipe as described above, it is advisable that the lateral surface 2b of the cathode 2 be made either cylindrical (FIG. 2), or polyhedral (FIG. 3). In the second case the cathode 2 is made in the form of a constant framework "2c" and consumable strips 2d made of a consumable material and secured thereon.

The first version of making the cathode 2 is the simplest, whereas the second is suitable when making such a cathode from fragments of a strip material, which substantially reduces the cost thereof. It will be understood that if the anode chamber 1 (FIG. 1) is a pipe of any other configuration, such as oval or rectangular, the cathode 2 should be of the same configuration.

The apparatus operates in the following manner.

Figure 4:
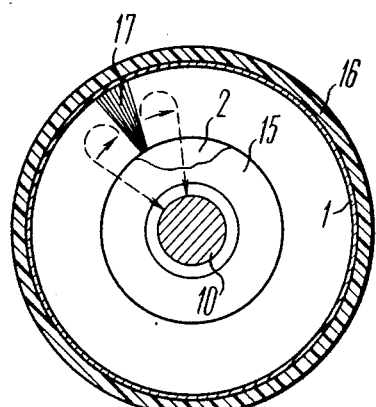
FIG. 4 diagrammatically illustrates the operation of the proposed apparatus shown in section along line IV—IV in FIG. 1.

The work 10 (FIG. 1) is fixed in a holder 10a and through the inlet 9 is introduced into the anode chamber 1 so that this work passes through the opening 2a of the cathode 2, as shown in the drawing, whereupon said holder 10a is secured to the inlet 9. Then, after producing required vacuum in the anode chamber 1, operating voltage is supplied to the anode 1 and to the cathode 2 from the direct current source, whereupon the solenoid 16 is switched on. Then a starting voltage is supplied to the cathode 2 and the starting electrode 3 from the pulsed current source 5. Such being the case, between the cathode 2 and the anode 1 an electric arc is produced whose cathode spot rotates on the lateral surface 2b of the cathode 2 under the influence of the magnetic field of the solenoid 16. The cathode spot causes evaporation of the material of the cathode 2 and formation of the plasma cloud 17 (FIG. 4) rotating in the plane perpendicular to the axis of the anode chamber 1 as is schematically shown by a solid arrow. Such being the case, the neutral macroparticles of the plasma stream 17 deposit on the inner surface of the anode chamber 1, whereas the positive ions are deflected from the potential barrier produced by the electric field in the plasma under the influence of the magnetic field and deposit on the surface of the work 10 which is shown by dashed lines in FIG. 4. Due to the rotation of the plasma cloud the work 10 is treated throughout the whole periphery thereof. The distance "s" (FIG. 1) from the lateral surface 2b of the cathode 2 to the inner surface of the anode chamber 1 is selected such as to provide for the treatment of the work 10 throughout the whole length "11" thereof.

Figure 5:
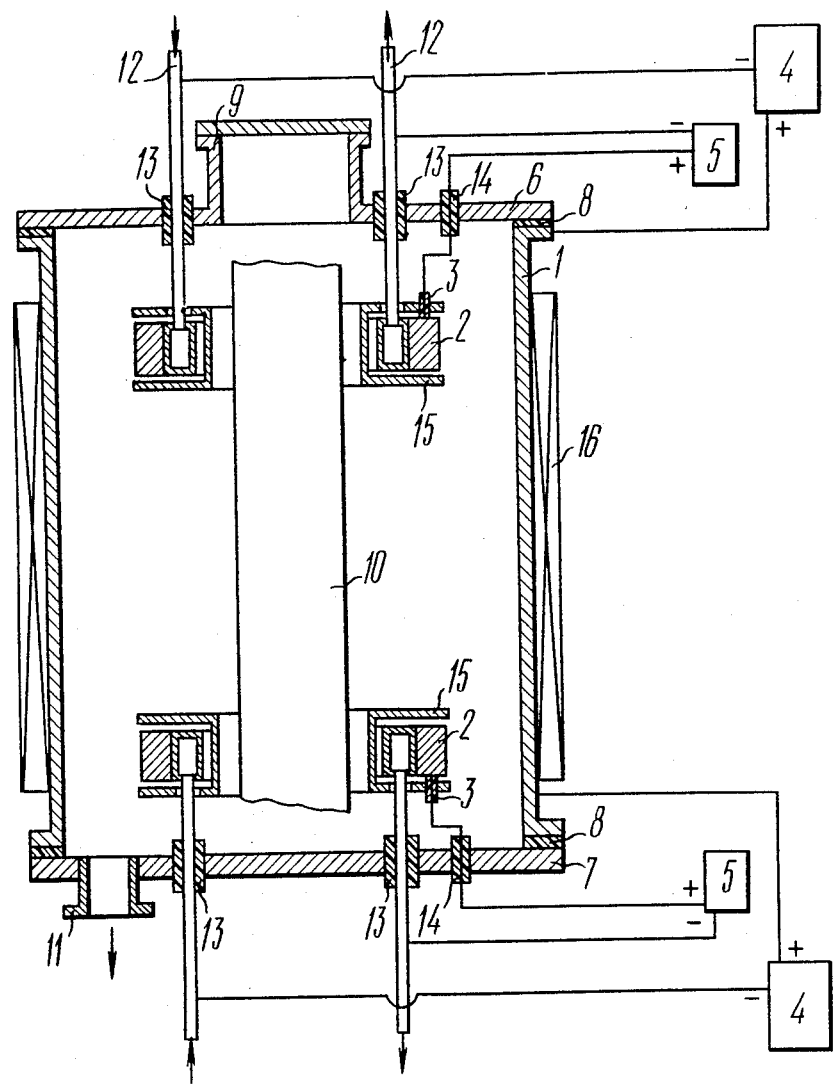
FIG. 5 is a longitudinal section of a modification of the proposed apparatus having two cathodes.

FIG. 5 shows another alternative modification of the apparatus of the present invention. This modification comprises two cathodes 2 which are similar to that described above and are disposed at the ends of the anode chamber 1. Each of these cathodes 2 is provided with a starting electrode 3 electrically insulated from one another and has a power unit of its own including the sources 4 and 5.

The operation of this modification is essentially similar to that described above. This modification allows a coating to be applied to the work 10 more rapidly and uniformly, since in this case the treatment of the latter proceeds from both ends simultaneously. In addition, in this case due to widening of the treatment zone the length of the work 10 can be increased by 1.5 to 2 times, as compared with the operation of the modification shown in FIG. 1, practically without an increase in the size of the apparatus.

It is to be noted that when using the modifications of the apparatus shown in FIGS. 1 and 5 the most uniform coating is produced on those sections of the work 10 which are not shaded from the plasma stream by the rods 12. A part of ions of the plasma deposit on these rods. This, firstly, causes a decrease in the thickness of the coating on the work 10 under the rods 12, and, secondly, causes a decrease to a certain extent of a ratio of deposit of the material of the cathode 2. It will be understood that if the number of the cathodes 2 is to be increased (which may be caused, for instance, by a necessity of raising the efficiency of treatment of comparatively long works), the number of rods 12 is to be increased as well, which leads to still greater losses of the material to be deposited of the work 10 and to a great non-uniformity of the coating.

Figure 6:
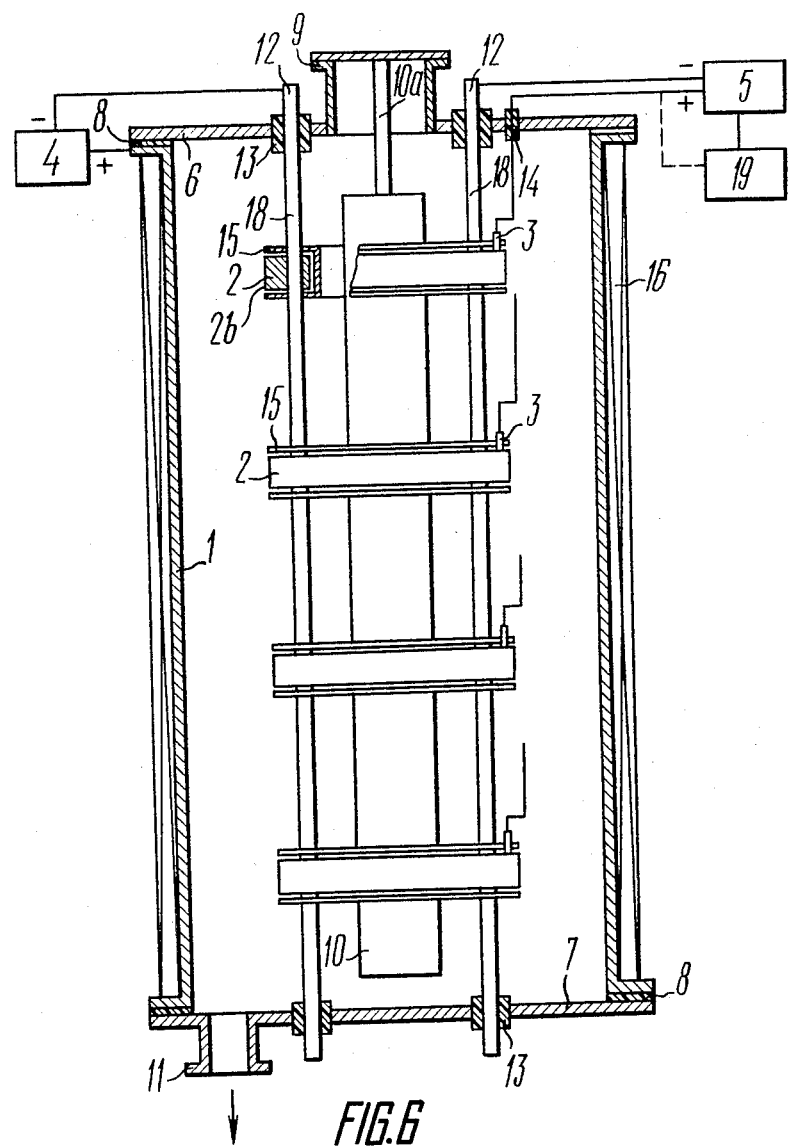
FIGS. 6 and 7 are cross-sections of modifications of the apparatus having four cathodes, FIG. 6 showing a modification having a solid anode, while a modification with a sectionized anode being shown in FIG. 7.
Figure 7:
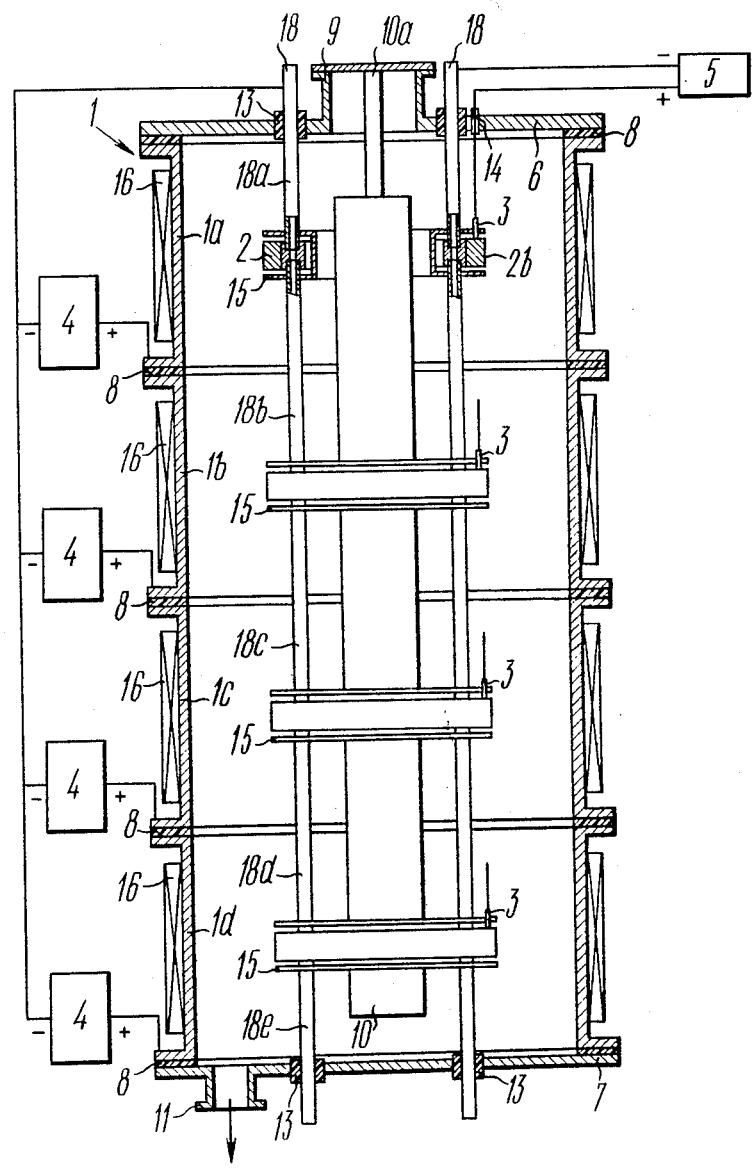

To reduce these losses in those cases when it is necessary to efficiently treat long (more than 1 m) works, in particular of a variable cross-section, it is expedient to take advantage of the modifications shown in FIGS. 6 and 7. FIG. 6 shows a modification of the plasma arc apparatus, which comprises several (in this case four) identical electrodes axially aligned in the anode chamber 1 on current rods 18 and provided with starting electrodes 3.

The current rods 18 do not in principle differ from the above rods 12 (FIGS. 1 and 5), but are common for all the cathodes 2, as a result of which the cathodes 2 are electrically interconnected. The apparatus is also provided with a control unit 19 for successively connecting and disconnecting the cathodes 2, connected to the starting electrode 3 of each cathode 2, as is shown by a dotted line for one starting electrode 3 only.

Since in this case the number of the current rods 18 is not increased with the increase in the number of the cathodes 2, the losses of the material are not very high and the uniformity of the coating application is more uniform.

In the course of operation of the above-described modification (FIG. 6) the arc is continuously transferred from one cathode 2 to another with the aid of a control unit 19 and thus the work 10 is continuously treated, from section to section, throughout the whole length thereof. The construction of the control unit is known to those skilled in the art and is selected in accordance with concrete conditions from a number of units of this type.

The modification of the apparatus, shown in FIG. 7 is substantially similar to that shown in FIG. 6 but as distinct from the latter it has no control unit 19, and the anode chamber 1 in this case is divided into separate anode sections 1a . . . 1d which are electrically insulated from one another by means of insulating packings 8. Each of these anode sections is provided with a magnetic system 16 and with a direct current source 4 for feeding the arc. One pulsed current source 5 is provided to start the arc, though it is clear that several such sources may be provided in accordance with the number of the anode sections. The total number of the cathodes 2 is also equal to the number of the anode sections 1a . . . 1d, and each of the cathodes are axially aligned in each of the anode sections 1a . . . 1d. The operation of the sources 4 and 5 is clear from FIG. 7 and does not require any detailed explanation.

When treating the work 10 in such a modification, several arcs are produced simultaneously, and each of these arcs burns in the respective electric group "anodes section—cathode". As a consequence, the work 10 is treated by several (in this case by four) plasma streams, which considerably intensifies the spraying process and improves the quality of the surface subjected to spraying, especially when treating elongated works.

It is to be noted that the current rods 18 described in two latter modifications of the apparatus and serving for supplying current for all the cathodes 2 may be both solid, as shown, for instance, in FIG. 6, and composed of separate sections 18a . . . 18e as shown in FIG. 7. It is clear that the second version of electrodes is simpler to produce.

To reduce irregularities in the coating on the surface of the work 10 on the sections under the cathodes 2 and under the rods 18, it is recommended that in the course of the treatment the work be moved in axial direction by a value not less than the width of the cathode 2 and periodically turned around its axis.

Figure 8:
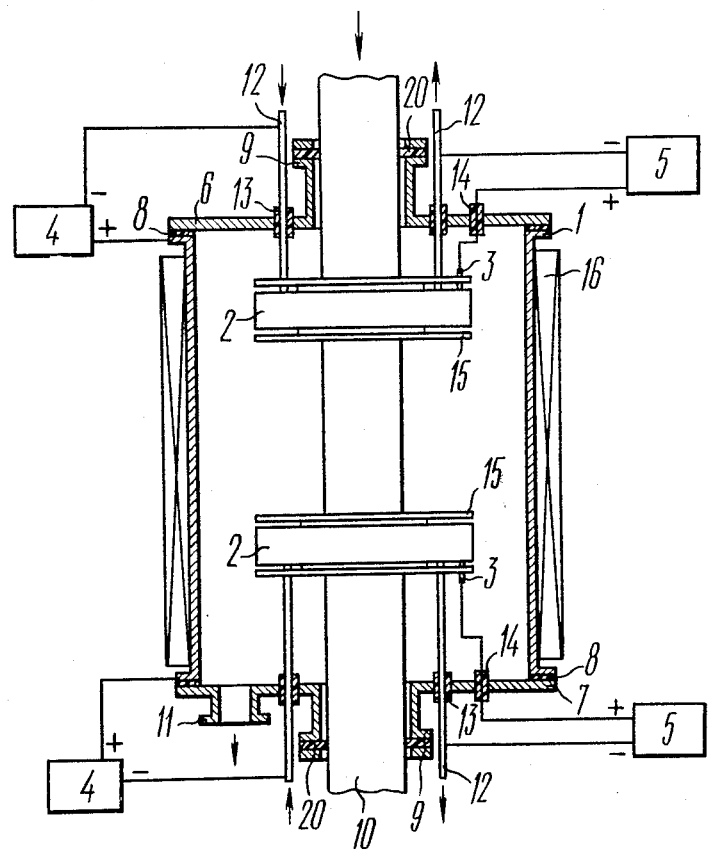
FIG. 8 shows the same as in FIG. 5 but a modification in which the plasma arc apparatus of the present invention is intended for continuous operation.

If the work 10 is of a uniform cross-section along the whole of its length and the latter is of a considerable extention (long shafts, strips, wire, bands etc.), it is advisable to use the modification of the apparatus of the invention, shown in FIG. 8, which modification with comparatively small sizes is a highly efficient apparatus of a continuous type. According to this modification the anode chamber 1 is provided with an inlet 9a and with an outlet 9b, both the inlet 9a and the outlet 9b being provided with a packing member 20. In the course of operation of the apparatus the work 10 is moved through the anode chamber 1 in axial direction shown by an arrow in the drawing and subjected to continuous plasma spraying process.

It is to be noted that in any of the above-described modifications of the apparatus of the invention it is possible to treat either one or several works 10 simultaneously. In the latter case the works are disposed in parallel relationship with each other and can be either immovable in the course of treatment or rotated around their axes by any conventional drive, for instance by a planetary gear.

While particular embodiments of the invention have been shown and described, various modifications thereof will be apparent to those skilled in the art and therefore it is not intended that the invention be limited to the disclosed embodiments or to the details thereof and the departures may be made therefrom within the spirit and scope of the invention as defined in the claims.

We claim:

1. A plasma arc apparatus for applying coatings comprising:
   (a) a working anode chamber of a non-magnetic metal, made in the form of a pipe of a uniform cross-section having a predetermined axial length and intended for work to be disposed therein and to be subjected to a plasma spraying process;
   (b) an annular consumable cathode having a central opening for work to be installed therewithin in a working position within said working anode chamber and having a cross-sectional configuration, which substantially coincides with the cross-sectional configuration of said pipe which forms said chamber, said cathode being disposed within the latter in coaxial relationship therewith and having a lateral evaporation surface that faces said anode chamber and is of an axial length less than the axial length of the anode chamber;
   (c) a starting electrode serving to start an arc discharge;
   (d) a direct current source for feeding electrical power to form an arc between said anode and cathode, said direct current source being connected with said anode and cathode;
   (e) a pulsed current source for starting the arc, said pulsed current source being initially connected with said cathode and the starting electrode;
   (f) a magnetic system for diverting charged particles of plasma produced in said working anode chamber from the surface of the anode chamber towards the working being treated, said system being mounted on the outer side of said pipe forming said working anode chamber.

2. An apparatus as claimed in claim 1, wherein the lateral surface of said cathode has an axial length of from 0.05 to 0.5 of the axial length of the anode.

3. An apparatus as claimed in claim 1, wherein said working anode chamber is made in the form of a cylindrical pipe.

4. An apparatus as claimed in claim 1, wherein there is provided one additional cathode and a starting electrode connected thereto, said additional cathode and additional starting electrode being similar to said first cathode and first starting electrode, respectively, said first and additional cathodes being disposed in axial relationship relative to the periphery of said anode chamber and electrically insulated from one another.

5. An apparatus as claimed in claim 1, wherein there are provided several additional cathodes disposed within said working anode chamber and provided with starting electrodes connected thereto, said additional cathodes and said starting electrodes being similar to said first cathode and first starting electrode, respectively, and also there are provided current rods mounted within said anode chamber and carrying said cathodes in axial relationship therewith and whereby an electrical connection between said cathodes is effected, and a control unit, connected with each of said starting electrodes, for successively switching on and off the respective cathodes.

6. An apparatus as claimed in claim 1, wherein said working anode chamber is divided into separate anode sections electrically insulated from one another and which further comprises several additional cathodes provided with starting electrodes connected thereto, said additional cathodes and starting electrodes being similar to said first cathode and first starting electrode, the total number of all said cathodes being equal to the number of said anode sections, and also current rods mounted in and electrically insulated from said anode chamber and carrying said cathodes axially aligned in each of the anode sections and electrically connecting the cathodes between themselves.

7. An apparatus as claimed in claim 2, wherein said anode chamber has the form of a cylindrical pipe.

8. An apparatus as claimed in claim 4, wherein said working chamber is made in the form of a cylindrical pipe and the lateral surface of said cathode has an axial length of from 0.05 to 0.5 of the axial length of said anode.

9. An apparatus as claimed in claim 5, wherein said working anode chamber is made in the form of a cylindrical pipe and the lateral surface of said cathode has an axial length of from 0.05 to 0.5 of the axial length of said anode.

10. An apparatus as claimed in claim 6, wherein each of said anode sections of said working anode chamber is made in the form of a cylindrical pipe, and the lateral surface of each of said cathodes has an axial length of from 0.05 to 0.5 of the axial length of the respective anode section.

11. An apparatus as claimed in claim 7, wherein the lateral surface of said cathode is cylindrical.

12. An apparatus as claimed in claim 7, wherein the lateral surface of said cathode is polyhedral.

13. An apparatus as claimed in claim 11, wherein there is further provided a screen shielding the whole surface of said cathode apart from its evaporation surface, said screen serving to prevent the formation of an arc between the anode chamber and the cathode surfaces that lie on the opposite side of said screen from the anode chamber surfaces.

14. An apparatus as claimed in claim 12, wherein there is further provided a screen shielding the whole surface of said cathode apart from its evaporation surface, said screen serving to prevent the formation of an arc between the anode chamber and the cathode surfaces that lie on the opposite side of said screen from the anode chamber surfaces.

* * * * *